US009322885B2

(12) United States Patent
Kain

(10) Patent No.: US 9,322,885 B2
(45) Date of Patent: Apr. 26, 2016

(54) CIRCUIT AND METHOD FOR EVALUATING CELLS IN A BATTERY

(71) Applicant: Infineon Technologies AG, Neubiberg (DE)

(72) Inventor: Clemens Kain, Kammern (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 168 days.

(21) Appl. No.: 14/089,815

(22) Filed: Nov. 26, 2013

(65) Prior Publication Data

US 2015/0145520 A1 May 28, 2015

(51) Int. Cl.
| | |
|---|---|
| H02J 7/00 | (2006.01) |
| H02J 7/14 | (2006.01) |
| G01R 31/36 | (2006.01) |
| H01M 10/44 | (2006.01) |

(52) U.S. Cl.
CPC ........... *G01R 31/3662* (2013.01); *H02J 7/0016* (2013.01); *H02J 7/0019* (2013.01); *G01R 31/3658* (2013.01); *H01M 10/441* (2013.01); *H02J 7/0018* (2013.01)

(58) Field of Classification Search
USPC ......... 320/116, 119, 118, 104, 117, 120, 121, 320/124, 132, 149, 162, 107, 131; 324/425, 324/426, 427, 428, 429, 430; 307/17, 83; 340/636.1, 636.2, 636.21, 636, 646
See application file for complete search history.

(56) References Cited

U.S. PATENT DOCUMENTS

| | | | | |
|---|---|---|---|---|
| 5,659,237 | A * | 8/1997 | Divan et al. | 320/119 |
| 8,269,455 | B2 * | 9/2012 | Marten | 320/107 |
| 2010/0090649 | A1 * | 4/2010 | Sardat et al. | 320/118 |
| 2010/0283433 | A1 * | 11/2010 | Oh et al. | 320/162 |
| 2012/0032681 | A1 * | 2/2012 | Fink | 324/430 |
| 2012/0194134 | A1 | 8/2012 | Kain | |
| 2014/0197783 | A1 * | 7/2014 | Kim et al. | 320/108 |

FOREIGN PATENT DOCUMENTS

DE 102012201381 A1 8/2012

OTHER PUBLICATIONS

Carl Bonfiglio and Werner Roessler: "A Cost Optimized Battery Management System with Active Cell Balancing for Lithium Ion Battery Stacks"; 978-1-4244-2601-0/09, 2009 IEEE, pp. 304-309. Downloaded on Nov. 17, 2009 from IEEE Xplore.
Wolfgang Schmid: "Erweiterte Batterie-Diagnose mittels spektraler Impedanz-Messtechnik", www.brs-messtechnik.de, Feb. 16, 2012; 4 pages.

* cited by examiner

*Primary Examiner* — Alexis A Boateng

(57) ABSTRACT

In various embodiments, a method for evaluating a cell of a battery is provided. The method may include: balancing a voltage of at least one cell of the battery using charge pulses, wherein the charge pulses are modulated with an oscillating test signal; measuring a current flow through the cell and measuring a voltage across the cell; demodulating the measured current and the measured voltage; and determining an impedance based on the demodulated current and the demodulated voltage.

Further, in various embodiments, a circuit is provided, including a balancing circuit configured to inductively transfer charges between cells in a battery using current pulses, and a control unit configured to control the balancing circuit to provide the current pulses, wherein an average value of the current pulses oscillates over time.

26 Claims, 4 Drawing Sheets

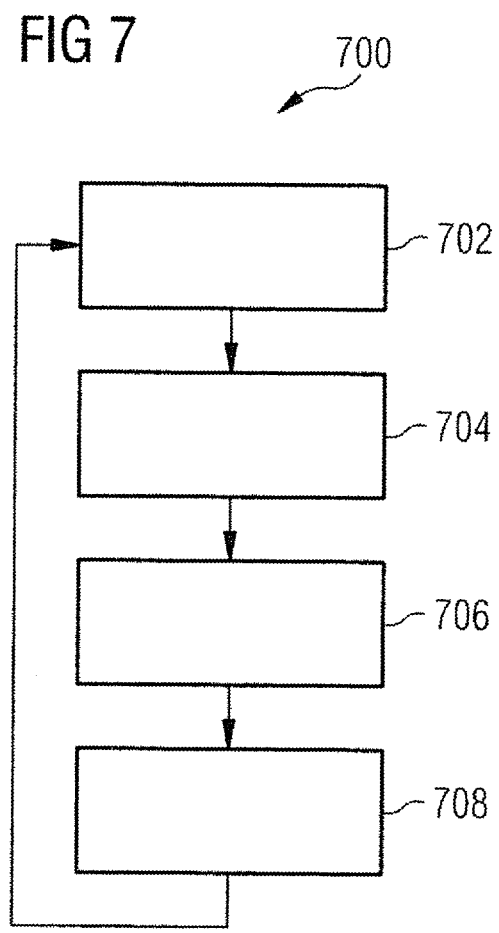

US 9,322,885 B2

CIRCUIT AND METHOD FOR EVALUATING CELLS IN A BATTERY

TECHNICAL FIELD

Various embodiments relate generally to circuits and methods for evaluating cells in a battery.

BACKGROUND

Cells, for example electrochemical cells, may be connected in series to form a battery. The cells may be damaged if upper and lower voltage limits of the cells are exceeded during charging and discharging of the battery. The voltages of the cells in the battery may be adjusted using active balancing. In top balancing, charge from a cell with a higher voltage than the other cells may be distributed to the battery. In bottom balancing, a cell with a lower voltage than the other cells may be charged by the battery. However, it may be difficult to determine the state of charge or state of health of individual cells in the battery, especially if the cells are connected in series.

SUMMARY

In various embodiments, a method for evaluating a cell of a battery is provided. The method may include: balancing a voltage of a cell of the battery using charge pulses, wherein the charge pulses are modulated with an oscillating test signal; measuring a current flow through the cell and measuring a voltage across the cell; demodulating the measured current and the measured voltage; and determining an impedance based on the demodulated current and the demodulated voltage.

Further, in various embodiments, a circuit is provided, the circuit including an active balancing circuit, a pulse generating unit, a measuring unit, a demodulation unit, and a calculation unit. The active balancing circuit may be configured to balance voltages of cells of a battery by inductively transferring charges between a respective cell and the battery using current pulses. The pulse generating unit may be configured to generate the current pulses, wherein the current pulses are modulated with a given frequency. The measuring unit may be configured to measure a voltage across the cell and a current flow through the cell. The demodulation unit may be configured to determine a voltage and a current at the given frequency from the measured voltage across the cell and current flow through the cell. The calculation unit may be configured to calculate an impedance of the cell from the voltage and the current determined at the given frequency.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the drawings, the left-most digit(s) of a reference number can identify the drawing in which the reference number first appears. The same numbers can be used throughout the drawings to reference like features and components. In the following description, various embodiments of the invention are described with reference to the following drawings, in which:

FIG. 7 shows an embodiment of a method for evaluating a cell in a battery.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
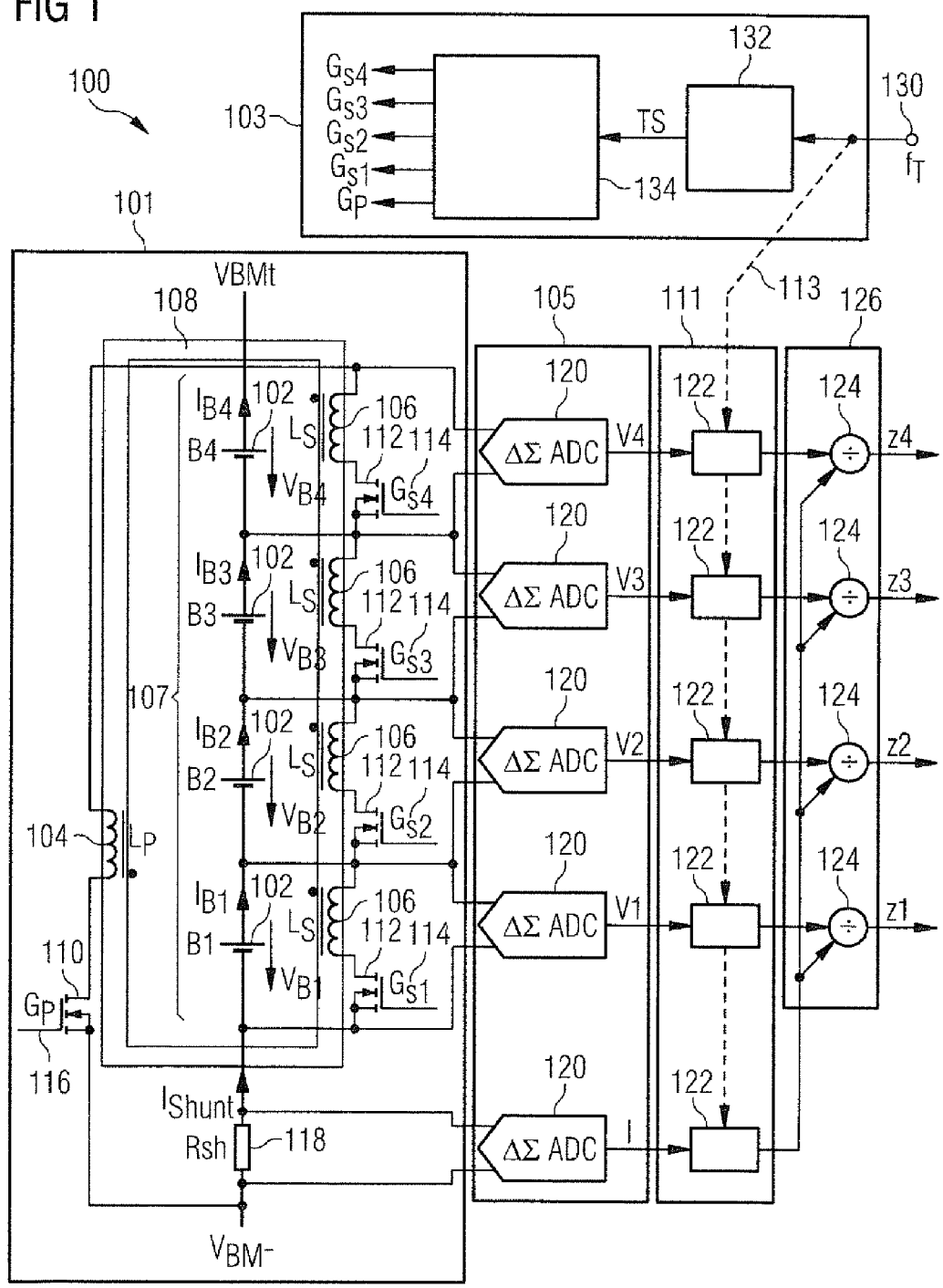
FIG. 1 shows an embodiment of a circuit.

FIG. 1 shows an embodiment 100 of a circuit. The circuit may be used to evaluated cells 102 in a battery 107. For example, it may be used to determine a state of charge (SoC) or a state of health (SOH) of the cells 102, for example via determining an impedance of the cells 102. The circuit may include a battery 107, a balancing circuit 101, a control unit 103, a measuring unit 105, a demodulation unit 111, and a calculation unit 126.

The battery 107 may include cells 102. The cells 102 may be connected in series with each other to form the battery 107. However, they can also be connected in a different manner. For example, cells 102 may be connected in parallel and the parallel connected cells may be connected to other parallel connected cells in series. While only four cells 102 are shown, the circuit may also have a different number of cells 102.

The circuit may be configured to transfer charges to and from any cell 102 in the battery 107. However, the circuit may also be configured to only transfer charges to the cells 102, that is to charge the cells 102, or be configured to only transfer charges from the cells 102, that is to discharge the cells 102.

In various embodiments, the balancing circuit 101 may include a transformer. The transformer may include a primary coil 104 and a plurality of secondary coils 106. The primary coil 104 and the plurality of secondary coils 106 may be magnetically coupled, for example via a magnetic core 108 or via another media. The primary coils 104 may be coupled across the battery 107. A respective secondary coil 106 may be coupled across a respective cell 102 of the battery 107. The ratio of the number of turns of the primary coil 104 to the number of turns of a secondary coil 106 may be N. As an example, for 12 cells 102, N may be N=8.

In various embodiments, the balancing circuit 101 may further include a first switching means 110 and a plurality of second switching means 112. The first switching means 110 may be configured to control a current flow through the primary coil 104. The first switching means 110 may be connected in series with the primary coil 104, where the series connection may be coupled across the battery 107. Each of the second switching means 112 may be configured to control a current flow through a respective secondary coil 106. The second switching means 112 may be connected in series with the respective secondary coil 106, where the series connection may be coupled across a respective cell 102.

The first switching means 110 may have a control input 116. The control unit 103 may provide a signal $G_P$ to the control input 116 for controlling the first switching means 110. Each of the second switching means 112 may have a respective control input 114. The control unit 103 may provide respective signals $G_{S1}$, $G_{S2}$, $G_{S3}$, and $G_{S4}$ to the respective control inputs 114 for controlling the respective second switching means 112. The first switching means 110 and a plurality of second switching means 112 may be MOSFETs.

The control unit 103 may be configured to control the balancing circuit 101 to provide current pulses. It may provide control signals $G_{S1}$, $G_{S2}$, $G_{S3}$, $G_{S4}$, and $G_P$ to the balancing circuit 101. The control signals $G_{S1}$, $G_{S2}$, $G_{S3}$, $G_{S4}$, and $G_P$ may control the balancing circuit 101 to transfer charges. In various embodiments, the balancing circuit 101 may be configured to inductively transfer charges between cells 102 of the battery 107. The charge may be transferred using current pulses.

The control signals $G_{S1}$, $G_{S2}$, $G_{S3}$ $G_{S4}$, and $G_P$ may be provided in such a manner that the transfer of charges may be modulated with a test signal. In other words, the transfer of charges may be influenced by a test signal in such a way that the transfer of charges may carry information contained in the test signal. In various embodiments, the transfer of charges may be modulated in amplitude, frequency or phase, or in a combination of these modulations. Different types of modulation are described in conjunction with FIGS. 4, 5 and 6.

In various embodiments, the information of the test signal may be a frequency. The control unit 103 may have an input 130 at which a frequency $f_T$ of oscillation may be input. The frequency $f_T$ and/or some of its harmonics $n \cdot f_T$ may be used to excite cells 102 with that frequency and impedances of the cells 102 may be measured at that frequency. No separate excitation circuit is required since the excitation may occur while transferring charges using the balancing circuit 101.

The control unit 103 and the balancing circuit 101 may from a pulse generating unit. They may be configured such that an average value of the current pulses oscillates over time. The average value may be determined by an amplitude of the pulses, a period of (or a time difference between) the pulses, a phase of the pulses or a width of the pulses, or a combination thereof.

The control unit 103 may have a converter circuit 132. The converter circuit 132 may convert the information, for example the frequency $f_T$, into timing signals TS that may determine the amplitude, the period, the phase and the width of the pulses.

The control unit 103 may have a distribution unit 134. The distribution unit 134 may distribute the timing signals TS to the first switching means 110 or to one of the second switching means 112 via the respective control signals $G_{S1}$, $G_{S2}$, $G_{S3}$, $G_{S4}$, and $G_P$. The distribution of the timing signals TS may depend on which cell 102 charge is to be transferred to and from. For example, if charge is to be transferred from the cell 102 labeled B4 to the battery 107, the distribution unit 134 may output timing signals for the control signal $G_{S4}$ followed by timing signals for the control signal $G_P$. As another example, if charge is to be transferred from the battery 107 to the cell 102 labeled B1, the distribution unit 134 may output timing signals for the control signal $G_P$ followed by timing signals for the control signal $G_{S1}$.

In order to determine which cell 102 is to be charged or discharged, the distribution unit 134 may be coupled to the cells 102 to determine their voltages $V_{B1}$, $V_{B2}$, $V_{B3}$, and $V_{B4}$. Analog-to-digital converters 120 may be connected to the cells 102 to provide their respective voltages V1, V2, V3, and V4. For the sake of simplicity, these connections are not shown in FIG. 1.

In various embodiments, at least one of peak values (or amplitudes A) of the current pulses, the time differences between adjacent current pulses, and the widths of current pulses may vary in an oscillating manner over time. In various embodiments, the oscillation of the average value of the current pulses may be sinusoidal. A sinusoidal oscillation may be easier to analyze in the frequency domain. However, the oscillation is not limited to a pure sinusoidal oscillation; it may include higher harmonics. In various embodiments, the oscillation of the average value of the current pulses may have an offset, for example $M_{OFFSET}$. The offset may be larger than an amplitude of the oscillation so that the oscillation of the average value does not change its sign. In various embodiments, a frequency of the oscillation, for example $f_T$, may be lower than 1 kHz. The current pulses may occur at a higher frequency, for example 100 kHz. The frequency of the oscillation may be lower by a factor 10 to 100 than the frequency of the current pulses. Because of the different frequencies, the frequency of the oscillation may be separated from the frequency of the current pulses. The frequency of the oscillation may be demodulated from the current pulses.

In various embodiments, the circuit may further include a shunt resistor 118 coupled in series to the battery 107. The shunt resistor 118 may be used to measure the current $I_{Shunt}$ flowing through the battery 107. Assuming that all of the second switching means 112 are OFF, that is non-conducting, and that the current flowing through the analog-to-digital converters 120 is negligible, current $I_{Shunt}$ may be equal to the current $I_{B1}$, $I_{B2}$, $I_{B3}$, and $I_{B4}$ through each of the cells 102.

In various embodiments, the circuit may include a measuring unit 105. The measuring unit 105 may be configured to determine a voltage across the shunt resistor 118 and the respective voltages $V_{B1}$, $V_{B2}$, $V_{B3}$ and $V_{B4}$ across respective cells 102. The voltages may be determined by analog digital converters 120 connected across the shunt resistor 118 and the respective cells 102. If the value Rsh of the shunt resistor 118 is known, current $I_{Shunt}$ may be calculated from the voltage provided by the analog-to-digital converter 120 connected to the shunt resistor 118.

In various embodiments, the circuit may further include a demodulation unit 111. The demodulation unit 111 may include a plurality of filters 122. The filters 122 may be configured to reject frequencies above a frequency of the oscillation of the average value of the current pulses. In other words, the frequency at which the current pulses occur may be suppressed and a frequency of the oscillation of the average values of the current pulses may be passed through the filters 122. In various embodiments, one of the filters 122 is coupled, for example via an analog-to-digital converter 120, to the shunt resistor 118 and filters the voltage across the shunt resistor 118. In various embodiments, respective filters 122 are coupled, for example via a respective analog-to-digital converter 120, to the respective cell 102 and filter the voltage across the respective cell 102. Filtering the voltages across the shunt resistor 118 and across a respective cell 102 may provide the average values of the current pulses. In other words, the frequency of the test signal may be recovered or demodulated. The average value may oscillate at a frequency, for example the frequency $f_T$ of modulation.

In various embodiments, a cutoff frequency of the plurality of filters 122 may be adjustable. The cutoff frequency may be adapted to the frequency of oscillation of the average values of the current pulses. The filters 122 may be coupled to the input 130 at which the frequency $f_T$ of the oscillation is input to the control unit 103, as is shown by the dotted line 113 in FIG. 1.

In various embodiments, the circuit may further include a calculation unit 126. The calculation unit 126 may be configured to determine the impedances Z1, Z2, Z3, and Z4 of the respective cells 102. The impedance Z1, Z2, Z3, and Z4 may be based on the filtered or demodulated voltage across the shunt resistor 118 and the respective filtered or demodulated voltage across the respective cell 102. The calculation unit 126 may include a plurality of dividers 124 which may divide a respective filtered or demodulated voltage across a respective cell 102 by the filtered or demodulated current I flowing through the respective cell 102. The filtered or demodulated current I flowing through the respective cell 102 may be based on the filtered or demodulated voltage across the shunt resistor 118 divided by the resistance Rsh of the shunt resistor 118.

The impedance of a cell 102 may be complex, that is, it may have a real and an imaginary part or a magnitude and a phase. The real part may increase with operating time and may be used to indicate a maximum storage capacity or a state of health (SoH) of the cell 102. The imaginary part may decrease in magnitude with the amount of charge stored and may be used to indicate a state of charge (SoC) of the cell 102.

For different frequencies, the real part of the impedance may be plotted on an X-axis and the imaginary part of the impedance may be plotted over a Y-axis, giving a Nyquist plot. The Nyquist plot may be approximated by an equivalent circuit of the cell 102. The equivalent circuit may have a resistor Rs connected in series to a parallel connection of a resistor Rp and a capacitor Cp. The values Rs, Rp, Cp may be used to determine state of health and a state of charge of the cell 102.

Figure 2:
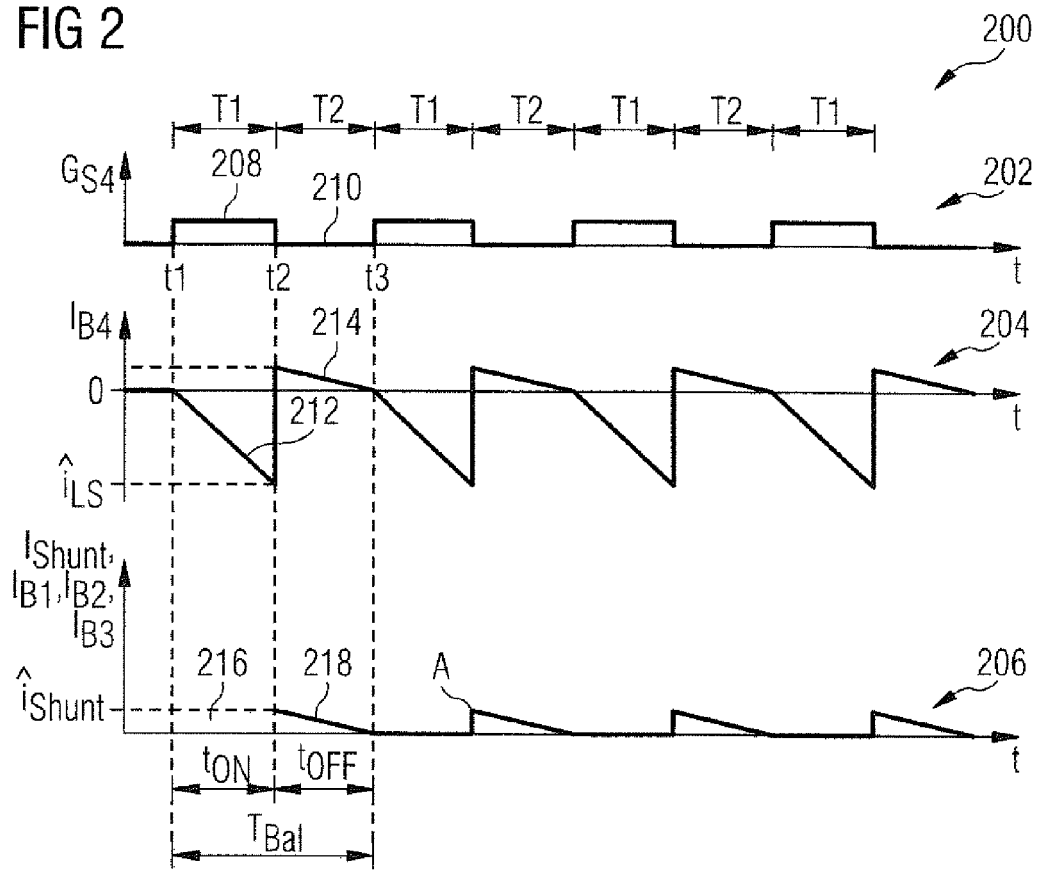
FIG. 2 shows an embodiment of diagrams to illustrate the operation of a balancing circuit.

FIG. 2 shows an embodiment 200 of diagrams 202, 204, and 206. Diagrams 202, 204, and 206 may occur when cells of a battery are actively balanced, for example using the circuit shown in FIG. 1. For the purpose of illustrating, the current pulses are shown without modulation.

As an example, cell 102 labeled B4 in FIG. 1 may have a voltage $V_{B4}$ that is higher than the voltages or the average of the voltages $V_B$ $V_{B2}$, and $V_{B3}$ of the other cells 102. The voltage $V_{B4}$ may limit the charging of the battery 107 since the voltage $V_{B4}$ may not exceed a maximum value without damaging the cell 102 labeled B4. In passive balancing, the voltage $V_{B4}$ may be reduced by connecting the cell 102 labeled B4 to a resistor. However, this may reduce of the amount of energy that can be provided by the battery 107 and may also cause thermal problems due to the energy dissipated in the resistor. In active balancing, the voltage $V_{B4}$ may be reduced by transferring charge from the cell 102 labeled B4 to the battery 107. The energy is not dissipated but may be used to charge cells 102 of the battery 107.

The diagrams 202, 204, and 206 are chosen for an exemplary case in which the cell 102 labeled B4 has a voltage that is to be reduced by transferring charge to the battery 107. However, the following description may also be applied to other cells 102, for example the cells 102 labeled B1, B2, and B3.

Diagram 202 may represent a control signal $G_{S4}$ applied to the control input 114 of the secondary switching means 112 of the cell 102 labeled B4 over time t. Diagram 204 may represent a current $I_{B4}$ flowing through the cell 102 labeled B4 over time t. Diagram 206 may represent a current $I_{Shunt}$ flowing through the battery 107 and the cells 102 labeled B1, B2, and B3 over time t.

While the balancing circuit 101 may be constructed like a transformer, it is operated so that current does not flow simultaneously in the primary coil 104 and in at least one of the secondary coils 106. Rather, the energy or charge transfer may be sequential. Energy may first be transferred via a secondary coil 106 into a magnetic field. Then, the energy stored in the magnetic field may be transferred to the primary coil 104. The transformer may be a operated like a flyback transformer.

Before time t1, all of the control signals $G_{S1}$, $G_{S2}$, $G_{S3}$, $G_{S4}$, and $G_P$ may be low and the first switching element 110 and the plurality of second switching elements 112 may be OFF, that is non-conducting. There is no current $I_{B1}$, $I_{B2}$, $I_{B3}$, and $I_{B4}$ flowing through the cells 102.

At time t1, the control signal $G_{S4}$ may change its value, for example to a high-value 208, and the corresponding second switching element 112 may begin to conduct. As a result, the corresponding secondary coil 106 is connected across the cell 102 labeled B4 and a current $I_{B4}$ through the cell 102 labeled B4 starts to ramp up, see diagram 204. The ramp 212 may be approximately linear:

$$I_{B4} = -V_{B4}/L_S \cdot t, \quad (1)$$

where $L_S$ is the inductance of the secondary coil 106.

The other control signals $G_{S1}$, $G_{S2}$, $G_{S3}$, and $G_P$ may remain unchanged. Since the first switching means 110 on the primary side remains open, no current $I_{Shunt}$ is build up to oppose the flux induced by the current ramp of $I_{B4}$, see diagram 206.

At time t2, after a time period $t_{ON}$, the control signal $G_{S4}$ may change its value again, for example to a low-value 210, see diagram 202. At this time, current $I_{B4}$ may have reached its maximum value of:

$$I_{B4} = \hat{i}_{Ls} \approx -\frac{V_{B4}}{L_S} \cdot t_{ON}. \quad (2)$$

At this time, the control signal $G_{S4}$ may turn the corresponding second switching element 112 OFF and the current $I_{B4}$ in the secondary coil 106 collapses.

The control signal $G_P$ may have logically inverse values of the control signal $G_{S4}$. At time t2, the control signal $G_P$ may also change its value, for example to a high-value. The control signal $G_P$ may cause the first switching means 110 to conduct when it is applied to its control input 116, thus allowing a current to flow through the primary coil 104. However, a control signal $G_P$ may not be necessary if the first switching means 110 has an integrated body diode which may act as a freewheeling diode. The first switching means 110 may be a MOSFET, for example an n-type MOSFET. The first switching means 110 may also be a diode, where the diode is coupled with its cathode to the primary coil 104 and with its anode to the negative terminal of the battery 107, for example via the shunt resistor 118.

The change in flux caused by turning OFF the corresponding second switching element 114 may cause a voltage in the primary coil 104 to rise very quickly until it reaches the voltage $V_{Bat} = V_{BM+} - V_{BM-}$ of the battery 107. A current $I_{Shunt}$ may start to flow through the primary coil 104 in the form of a descending ramp 218. The ramp 218 may have a starting value of:

$$\hat{i}_{Shunt} \approx \frac{\hat{i}_{Ls}}{N} \quad (3)$$

and may decrease with time t:

$$I_{Shunt} = \hat{i}_{Shunt} - V_{Bat}/L_P \cdot t. \quad (4)$$

where $L_P$ is the inductance of the primary coil 104.

The current $I_{Shunt}$ may also flow through the cell 102 labeled B4, so that $I_{B4} = I_{Shunt}$ for the time between t2 and t3.

At time t3, after a time period $t_{OFF}$ $$t_{OFF} = \frac{\hat{i}_{Ls}}{N} \cdot \frac{L_P}{V_{Bat}}, \quad (5)$$

the current $I_{Shunt}$ returns to zero.

A balancing period $T_{Bal}$ of the current pulses may be given by:

$$T_{Bal} \approx t_{ON} + t_{OFF} \quad (6)$$

During a first time period T1, the transfer of charges may be a discharging of a cell 102. During a second time period T2, the transfer of charges may be a charging of the battery 107. The first time period T1 may also include a phase in which no current flows, for example before the ramp 212 starts. The second time period T2 may also include a phase in which no current flows, for example after the ramp 214 ends. However, if there are times when no current flows, the charge transfer may be less effective as there are times when no charge is transferred. In FIG. 2, neither the first time period T1 nor the second time period T2 have phases in which no current flows.

The waveforms during the first time period T1 and the second time period T2 may be repeated periodically over time t, as is shown in diagrams 202, 204, and 206. The repetition of the discharging of the cell 102 and the charging of the battery 107 may be stopped when the voltage of the cell 102 has been sufficiently reduced, for example when it has a voltage that is equal to or less than the average of the voltages of the other cells 102 or that is below an upper voltage limit. The battery 107 may then be continued to be charged without the risk of a cell 102 being damaged due to over voltage.

During charging the battery 107, the voltage of another cell 102 may approach an upper allowable voltage. The procedure described above may then be applied to this cell 102 to distribute its excess charge over the battery 107. The distribution unit 134 may then apply corresponding control signals $G_{S1}$, $G_{S2}$, $G_{S3}$, $G_{S4}$, and $G_P$ to the first switching means 110 and the plurality of second switching means 112.

In FIG. 2, the current pulses 212, 214, and 218 are not modulated, that is they do not carry information of a test signal, and basically remain the same over time t. FIGS. 3 to 6 show embodiments of current pulses that are modulated.

Figure 3:
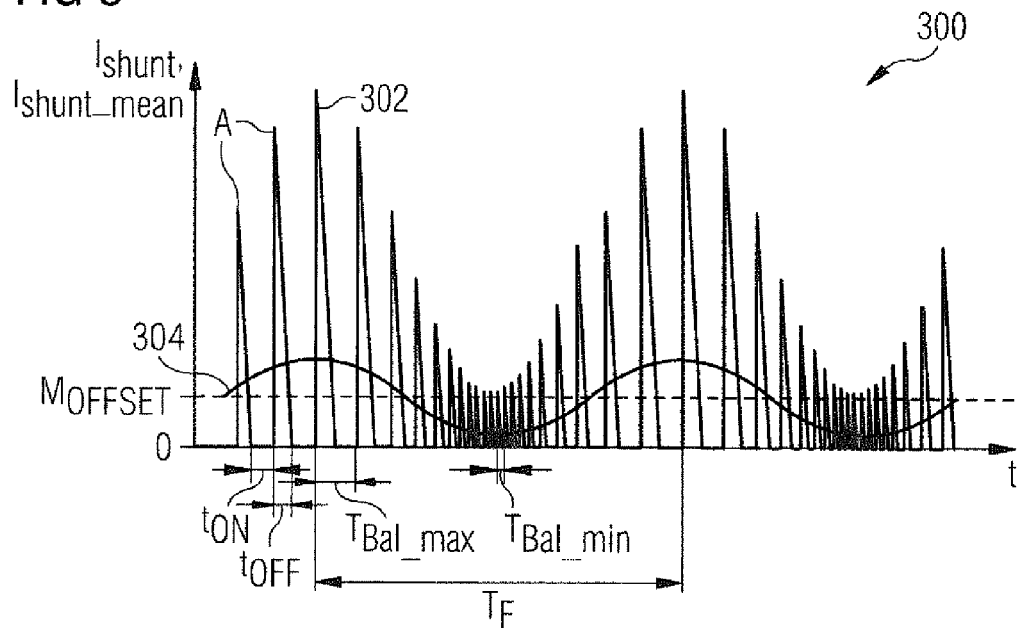
FIG. 3 shows an embodiment of modulated current pulses.
Figure 4:
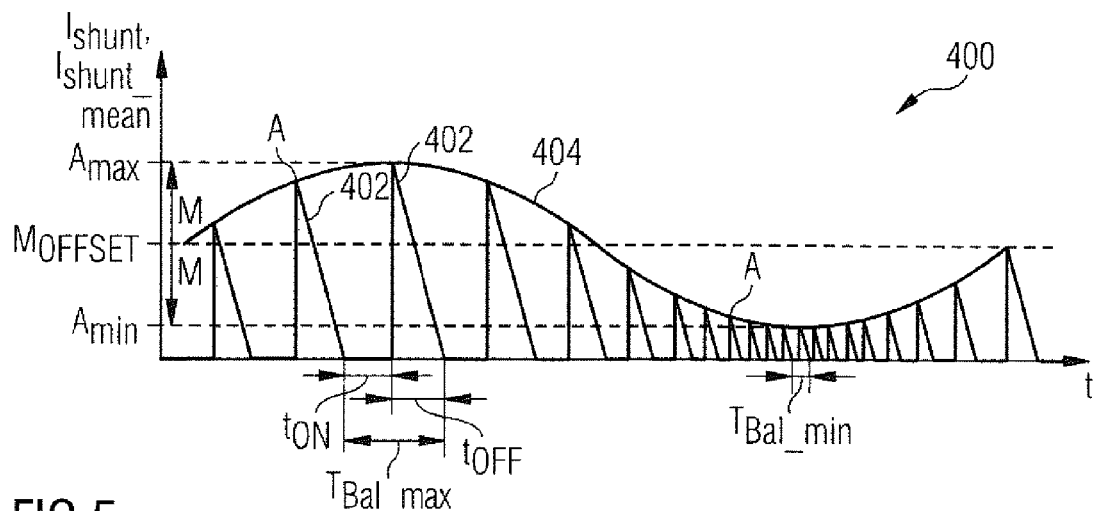
FIG. 4 shows an embodiment of modulated current pulses.

FIG. 3 shows an embodiment 300 of modulated current pulses $I_{Shunt}$. For the sake of clarity, only current $I_{Shunt}$ is shown, however currents $I_{B1}$, $I_{B2}$, $I_{B3}$, and $I_{B4}$ may be the same for time period $t_{OFF}$, as was described above. Waveform 302 shows a sequence of current pulses like the current pulses 218 shown in diagram 206 of FIG. 2. However, in contrast to diagram 206, the current pulses may be modulated by a varying time $t_{ON}$: they may have different widths $t_{ON}$, $t_{OFF}$ and different amplitudes A. The amplitude A of the current pulses 218 may be equal to FIG. 4 shows an embodiment 400 of modulated current pulses $I_{Shunt}$ at a different scale for additional illustration of FIG. 3.

The amplitude A of a pulse may be determined by time $t_{ON}$. It may be shown that the amplitude A of a current pulse 302, 402 is directly proportional to $t_{ON}$, see Eq. 2 and 3. The width $t_{OFF}$ of the current pulse 302, 402 may be determined by the time it takes for the current ramp 214 to reach the value of zero, which may be given by the amplitude A. It may be shown that the width $t_{OFF}$ of a current pulse is also directly proportional to $t_{ON}$.

Large values of $t_{ON}$ may therefore lead to large current pulses 302, 402 separated by large time intervals and small values of $t_{ON}$ may lead to small current pulses 302, 402 separated by small time intervals. For example, FIG. 4 shows current pulses 402 with amplitudes A between $A_{min}$ and $A_{max}$ and balancing periods $T_{Bal}$ between $T_{Bal\_min}$ and $T_{Bal\_min}$. As varying $t_{ON}$ may lead to different amplitudes A and to different balancing periods $T_{Bal}$, the modulation of the current pulses $I_{Shunt}$ may be regarded as a combination of amplitude modulation and frequency modulation.

Like in FIG. 2, there are no times in which no charge is transferred. Different widths $t_{ON}$ and $t_{OFF}$ may therefore lead to different balancing periods $T_{Bal}$.

It may be shown that an average value of a current pulse 302, 402 over its balancing period $T_{Bal}$ is directly proportional to $t_{ON}$. Varying $t_{ON}$ may therefore lead to a proportional change in the average value. Waveform 304 in FIG. 3 and waveform 404 in FIG. 4 show average values $I_{Shunt\_mean}$ of the current peaks over time t. Waveform 304 and 404 may be achieved by varying $t_{ON}$ in the same manner as the average value $I_{Shunt\_mean}$ over time t.

Waveforms 304 and 404 may be oscillations. The oscillation may have an offset $M_{OFFSET}$. The offset $M_{OFFSET}$ may be larger than an amplitude $M=(A_{max}-A_{min})/2$ of the oscillation. In other words, the average value $I_{Shunt\_mean}$ doesn't change its sign. The oscillation may be a sinusoidal with a frequency of $f_F=1/T_F$. The frequency $f_F=1/T_F$, which may be a modulation frequency, may be lower, for example by a factor 10 to 100, than the frequency $f_{Bal}=1/T_{Bal}$ of the current pulses. The frequencies $f_{Bal}$ of the current pulses may therefore be filtered out, for example by a low pass or a band pass, leaving the oscillating average value $I_{Shunt\_mean}$.

The current pulses 302 and 402 flow through all the cells 102 of the battery 107 so that all of the cells 102 will be excited not only by the current pulses but also by the oscillating average value $I_{Shunt\_mean}$. The average value $I_{Shunt\_mean}$ may therefore be used to excite the cells 102 for impedance measurements, as was described above.

The values for $t_{ON}$ may vary over time t and may for example be generated in the converter circuit 132 according to:

$$t_{ON}(t) = t_{OFFSET} + A_{tON} \cdot \cos(2\pi f_F \cdot t). \quad (7)$$

The values of $t_{OFFSET}$ and $A_{tON}$ may determine $M_{OFFSET}$ and M, respectively. The frequency $f_F$ which is input to the control unit 103 may be regarded as a test signal and may be varied so that the impedance of cells 102 may be measured at different frequencies.

Figure 5:
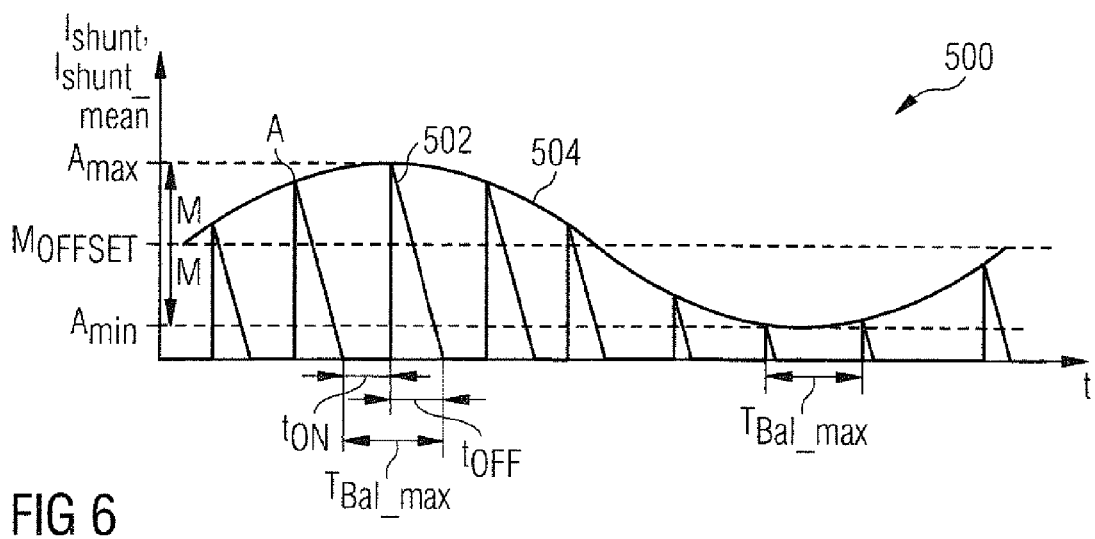
FIG. 5 shows an embodiment of modulated current pulses.

FIG. 5 shows an embodiment 500 of modulated current pulses $I_{Shunt}$. Waveform 502 shows a sequence of current pulses like the current pulses 402 shown in FIG. 4. The amplitude A of the pulse may again be directly proportional to $t_{ON}$. The width $t_{OFF}$ of the current pulse may again be directly proportional to $t_{ON}$. However, in contrast to waveforms 402, the current pulses 502 may have a constant balancing period $T_{Bal}$, for example $T_{Bal\_max}$. Since the widths $t_{ON}$ and $t_{OFF}$ of successive current pulses 502 differ, the current pulses do not directly follow each other, that is, there may be times in which no current is flowing in the primary coil 104 or the secondary coil 106 during the first time period T1 and the second time period T2.

It may be shown that an average value 504 of a current pulse is 502 proportional to the square of $t_{ON}$. Varying $t_{ON}$ in a sinusoidal manner, for example according to Eq. (7), may therefore lead to a squared sinusoidal change in the average value. Using the trigonometric relation $\cos^2 x=(1+\cos 2x)/2$, the average value will have frequencies of $f_T$ and $2f_T$. The higher frequencies of the current pulses may again be filtered out, for example by a low pass or a band pass. The modulated current pulses $I_{Shunt}$ may be regarded as a type of amplitude modulation.

Figure 6:
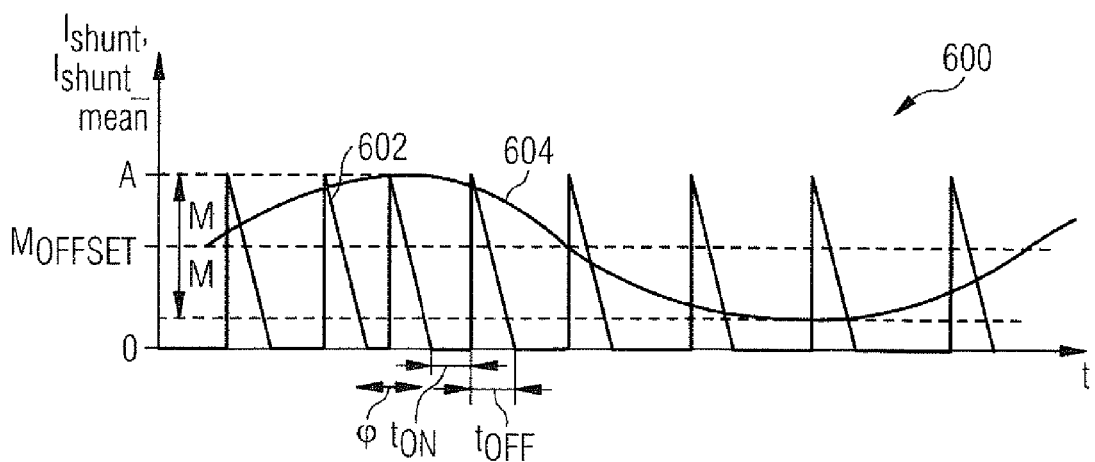
FIG. 6 shows an embodiment of modulated current pulses.

FIG. 6 shows an embodiment 600 of modulated current pulses $I_{Shunt}$. Waveform 602 shows a sequence of current pulses like the current pulses 218 shown in FIG. 2. The amplitude A of the current pulses, the width $t_{OFF}$ of the current pulse and the balancing period $T_{Bal}$ may be constant. However, in contrast to diagram 206, the current pulses 602 may have different phase shifts with regard to the balancing period. The different phase shift may be chosen so that an average value 604 of the current pulses is periodical, for example sinusoidal, over time t, for example with a frequency of $f_T$. The higher frequencies of the current pulses 602 may again be filtered out, for example by a low pass or a band pass. The modulated current pulses $I_{Shunt}$ may be regarded as a phase modulation.

FIG. 7 shows an embodiment 700 of a method for evaluating a cell, for example a cell 102, in a battery, for example in a battery 107. Evaluating a cell may include determining its impedance. It may include determining a state of health and a state of charge of the cell.

The method may include a step 702 of balancing voltages of the cells. The voltages may be balanced by transferring charges between cells. For example, charge from a cell with a voltage that is too high may be removed from the cell to reduce the voltage of the cell. The charge may be transferred from the cell to the battery. As another example, charge may be added to the cell to increase its voltage if its voltage is too low. The charge may be transferred from the battery to the cell. The charge may be transferred using pulses, such as current pulses. However, different means of transferring charge are possible.

The charge transfer, for example by means of current pulses, may be modulated. In other words, the charge transfer or the current pulses may be modified by a signal and may carry information about the signal. The charge transfer or the current pulses may act like a carrier wave for the information-bearing signal. The information may be a frequency, for example $f_T$. The modulation may be an amplitude modulation, a frequency modulation, a phase modulation, a combination thereof, or any other kind of modulation.

The modulation may result in an oscillating value, for example a periodically varying value or a decaying oscillating value, of the charge transfer or the current pulses. The value may, for example be an amplitude, an average value, a frequency, or a phase of a charge transfer or current pulse, or a combination thereof. For example, the modulation may cause the average value to have a periodically varying value, that is to be a sinusoidal.

The method may include a step 704 of measuring a current, such as for example current $I_{Shunt}$, flowing through the cell and measuring a voltage, such as for example $V_{B1}$, $V_{B2}$, $V_{B3}$, or $V_{B4}$, across the cell. The current flowing through the cell may be the same as a current flowing through the battery, for example if the cell is connected in series with other cells to form the battery. However, the current flowing through a respective cell may also be measured by other methods, for example via a respective shunt resistor connected in series with the cell.

The method may include a step 706 of demodulating the measured current and demodulating the measured voltage. The demodulation may occur in the frequency domain, for example using filters, such as low-pass or band-pass filters 122. Demodulation may be simplified if the current is an oscillation as oscillation may have frequencies limited to a certain region in the frequency domain. However, any kind of demodulation may be used that recovers the information-bearing signal from the modulated current pulses. Examples of demodulators include envelope detectors, fast Fourier transformation (FFT) and phase demodulators.

The method may include a step 708 of determining an impedance, for example Z1, Z2, Z3, and Z4, based on the demodulated current and the demodulated voltage. The impedance may be obtained by dividing the demodulated voltage by the demodulated current. If the demodulated voltage and the demodulated current are present in a digital form, for example if they are sampled by analog to digital converters 120, the division may be performed by a digital signal processing unit (DSP). The impedance may have a real part and an imaginary part. It may also be presented by a magnitude and a phase.

The method may repeat steps 702, 704, 706 and 708 with the charge transfer or current pulses being modulated with a different frequency $f_T$. A Nyquist curve may be drawn, showing the real part on the X-axis and the imaginary part on the Y-axis with the frequency of the modulation signal as a parameter. A Nyquist curve of an equivalent circuit model of the cell may be fitted to the measured Nyquist curve and parameters of the equivalent circuit may be determined. The parameters of the equivalent circuit may be used to determine a state of charge and a state health of the cell.

The method may be repeated and the respective impedance may be determined for all the cells. For example, the impedance of cells which do not share a common node with the cell that is to be discharged may be determined. As an example, cell 102 labeled B4 may be discharged and the impedance Z1 and Z2 of cells 102 labeled B1 and B2 may be determined. Or as another example, cell 102 labeled B1 may be discharged and the impedance Z3 and Z4 of cells 102 labeled B3 and B4 may be determined.

In various embodiments, a method for measuring an impedance of a cell, for example of a cell 102, in a battery, for example of a battery 107, is provided. The method may include transferring charge to or from a cell. It may further include modulating the charge transfer with a test signal, for example $t_{ON}(t)$. In various embodiments, the test signal may be periodic. In various embodiments, the charge may be transferred inductively. However, the charge may be transferred in other ways, for example capacitively. In various embodiments, the charge may be transferred in pulses. The pulses may be current pulses. In various embodiments, the test signal may modulate an average value of the pulses. In various embodiments, the test signal may modulate at least one of the following: an amplitude of the pulses, a duration of the pulses, a frequency of the pulses, and a phase of the pulses. In various embodiments, a pulse during a first time period, for example T1, removes charge from the cell and a pulse during a second time period, for example T2, transfers this charge to the battery. In various embodiments a pulse during a first time period, for example T1, removes charge from the battery and a pulse during a second time period, for example T2, transfers this charge to the cell. In various embodiments, the removal of charge during the first time period and the transfer of charge during the second time period are repeated until the cell of the battery is balanced, that is, until the cell has a voltage that allows further charging or discharging of the battery without damaging the cell. In various embodiments, the modulation of the charge transfer may take place during first time periods or during second time periods, or during first time periods and during second time periods. In various embodiments, a fundamental period, for example $T_T$, of the test signal is chosen to be larger by a factor of 10 than the time period defined by the first time period together with the second time period. The time period may for example be $T_{Bal}$. In various embodiments, the method may further include demodulating a signal representing the measured current flow, for example I, through the battery and demodulating a signal representing the measured voltage, for example V1, V2, V3 and V4, across the cell. In various embodiments, demodulating may include filtering the corresponding signal to suppress frequencies higher than a fundamental frequency of the test signal. The fundamental frequency of the test signal may be the inverse of the fundamental period $T_T$. It may be the lowest frequency of a periodic test signal. If the test signal is not a pure sine it may contain higher harmonics of the fundamental frequency. In various embodiments, the method may further include determining the complex impedance of the cell using the demodulated signals. In various embodiments, the impedance of the cell may be used to determine at least one of a state of charge and a state of health of the cell. In various embodiments, the method may further include determining the impedance of the cell at other frequencies of the test signal. In various embodiments, all the cells of the battery are evaluated.

The waveforms shown in FIGS. 2 to 6 are examples of top balancing in which the cell 102 labeled B4 has a voltage that is to be reduced by transferring charge to the battery 107. However, the description may also be applied to different cases, for example during bottom balancing, in which a cell 102, for example the cell 102 labeled B4, has a voltage that is to be increased by transferring charge from the battery 107 to the cell 102. During a first time period T1, the transfer of charges may be a discharge of the battery 107. During a second time period T2, the transfer of charges may be a charge of a cell 102. In FIG. 2, diagram 202 would then show control signal $G_P$, diagram 204 would show currents $I_{Shunt}$, $I_{B1}$, $I_{B2}$, $I_{B3}$, and diagram 206 would show the current $I_{B4}$ through the cell 102.

The circuit 100 and method 700 described use a transformer that is operated as a flyback transformer. However, any other kind of DC-DC converter may be used, for example boost converters, buck converters, converters with continuous or discontinuous current modes, resonant converters, synchronous converters, and so on.

The circuit and the waveforms shown are used in an active balancing circuit. However, the method may also be applied to a passive balancing circuit. In a passive balancing circuit, a charge transfer from a cell to a resistor may be modulated to carry the frequency information needed for impedance measurement.

In the circuit and the waveforms shown, the charge to be transferred is stored in a magnetic field. However, the charge to be transferred may also be stored in an electric field, for example in a capacitor. The transfer of charge may be modulated to carry the frequency information needed for impedance measurement when charging the capacitor, when discharging the capacitor, or both when charging and discharging the capacitor. Charge may be transferred directly between two cells via the capacitor, for example from the cell with the highest voltage to the cell with the lowest voltage. The capacitor may be multiplexed to the cells. A charge pump may be used if charge is to be transferred from a cell to the battery.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit, comprising:
   a balancing circuit, configured to inductively transfer charges between cells in a battery using current pulses, and
   a control unit configured to control the balancing circuit to provide the current pulses, wherein an average value of the current pulses oscillates over time;
   wherein the oscillation of the average value is sinusoidal; and where a frequency of the oscillation is lower than 1 kHz.

2. The circuit of claim 1, wherein
   at least one of:
     peak values of the current pulses;
     time differences between adjacent current pulses; and
     widths of current pulses
   varies in an oscillating manner over time.

3. The circuit of claim 1, wherein
   the balancing circuit comprises a transformer,
     wherein the transformer comprises a primary coil and a plurality of secondary coils, wherein
     the primary coils is coupled across the battery, and
     a respective secondary coil of the plurality of the secondary coils is coupled across a respective cell of the battery.

4. The circuit of claim 3, wherein
   the balancing circuit further comprises:
     a plurality of second switching means, wherein a respective of the second switching means is configured to control a current flow through a respective secondary coil, wherein
   the plurality of second switching means are controlled by the control unit.

5. The circuit of claim 4, wherein
   the balancing circuit further comprises:
     a first switching means configured to control a current flow through the primary coil, wherein
   the first switching means is controlled by the control unit.

6. The circuit of claim 1, further comprising
   a shunt resistor coupled in series to the battery.

7. The circuit of claim 6, further comprising
   a measuring unit configured to determine a voltage across the shunt resistor and a respective voltage across a respective cell.

8. The circuit of claim 7, further comprising
   a plurality of filters configured to reject frequencies above a frequency of the oscillations of the average value of the current pulses, wherein
   one of the filters is coupled to the shunt resistor and filters the voltage across the shunt resistor; and
   respective filters are coupled to respective cells and filter the respective voltage across the respective cell.

9. The circuit of claim 8, wherein
   a cutoff frequency of the filters is adapted to the frequency of the oscillations of the average values of the current pulses.

10. The circuit of claim 8, further comprising
    a calculation unit configured to determine an impedance of a cell based on the filtered voltages across the shunt resistor and the filtered voltage across the respective cell.

11. A method for evaluating cells of a battery, comprising:
    balancing a voltage of a cell using charge pulses, wherein the charge pulses are modulated with an oscillating test signal;

measuring a current through the cell and measuring a voltage across the cell;
demodulating the measured current and the measured voltage; and
determining an impedance based on the demodulated current and the demodulated voltage.

12. The method of claim 11, wherein
the test signal is periodic.

13. The method of claim 11, wherein
the charge pulses are inductively generated current pulses.

14. The method of claim 11, wherein
the test signal modulates an average value of the charge pulses.

15. The method of claim 14, wherein
the test signal modulates at least one of the following:
  an amplitude of the pulses;
  a duration of the pulses;
  a phase of the pulse; and
  a frequency of the pulses.

16. The method of claim 11, wherein
a charge pulse during a first time period removes charge from the cell and a charge pulse during a second time period transfers this charge to the battery; or
a charge pulse during a first time period removes charge from the battery and a charge pulse during a second time period transfers this charge to the cell.

17. The method of claim 16, wherein
the removal of charge during the first time period and the transfer of charge during the second time period is repeated until the cells of the battery are balanced.

18. The method of claim 16, wherein
the modulation of the charge transfer takes place during at least one of:
  first time periods, and
  second time periods.

19. The method of claim 16, wherein
a period of the test signal is chosen to be larger by a factor of 10 than the time period defined by the first time period together with the second time period.

20. The method of claim 11, wherein
demodulating the measured current and the measured voltage comprises:
  demodulating a sampled signal representing the measured current through the battery; and
  demodulating a sampled signal representing the measured voltage across the cell.

21. The method of claim 20, wherein
demodulating comprises filtering the corresponding signal to suppress frequencies higher than a fundamental frequency of the test signal.

22. The method of claim 20, further comprising
determining the complex impedance of the cell using the demodulated signals.

23. The method of claim 22 wherein
the impedance of the cell is used to determine at least one of:
  a state of charge; and
  a state of health
of the cell.

24. The method of claim 22, further comprising
determining the impedance of the cell at other frequencies of the test signal.

25. The method of claim 11, wherein
all the cells of the battery are evaluated.

26. A circuit, comprising:
an active balancing circuit, configured to balance voltages of cells of a battery by inductively transferring charges between a respective cell and the battery using current pulses;
a pulse generating unit, configured to generate the current pulses, wherein the current pulses are modulated with a given frequency;
a measuring unit, configured to measure a voltage across the cell and a current flow through the cell;
a demodulation unit, configured to determine a voltage and a current at the given frequency from the measured voltage across the cell and current flow through the cell; and
a calculation unit, configured to calculate an impedance of the cell from the voltage and the current determined at the given frequency.

* * * * *